(12) United States Patent
Kim et al.

(10) Patent No.: US 6,232,563 B1
(45) Date of Patent: *May 15, 2001

(54) BUMP ELECTRODE AND METHOD FOR FABRICATING THE SAME

(75) Inventors: Seong Jin Kim, Seoul; Young Sang Baek, Kyungki-do, both of (KR)

(73) Assignee: LG Electronics Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/755,142

(22) Filed: Nov. 22, 1996

(30) Foreign Application Priority Data

Nov. 25, 1995 (KR) ................................. 95/43743
Dec. 1, 1995 (KR) ................................. 95/46106

(51) Int. Cl.[7] .................................. H01L 23/52
(52) U.S. Cl. ..................... 174/261; 257/737; 257/738; 257/780; 438/613
(58) Field of Search ............... 174/261; 257/737, 257/738, 769, 750, 758, 780, 781; 361/773, 779; 438/613, 614

(56) References Cited

U.S. PATENT DOCUMENTS

| | | | |
|---|---|---|---|
| 4,389,516 | * 6/1983 | Sugio et al. | 525/534 |
| 5,059,553 | * 10/1991 | Berndlmaier et al. | 438/614 |
| 5,065,505 | * 11/1991 | Matsubara et al. | 29/830 |
| 5,123,986 | 6/1992 | Sugiyama et al. | 156/230 |
| 5,290,732 | * 3/1994 | Kumar et al. | 438/614 X |
| 5,310,699 | * 5/1994 | Chikawa et al. | 438/614 X |

FOREIGN PATENT DOCUMENTS

| 4-196434 | * 7/1992 | (JP) . |
|---|---|---|
| 6-224252 | * 8/1994 | (JP) . |
| 6-232211 | * 8/1994 | (JP) . |

* cited by examiner

Primary Examiner—Albert W. Paladini
(74) Attorney, Agent, or Firm—Morgan, Lewis & Bockius LLP

(57) ABSTRACT

A bump electrode is provided for connecting a substrate to an external terminal using an adhesive material including a plurality of conductive elements. The bump electrode includes a pad over the substrate, an electrically conductive bump over the pad for contacting the external terminal through the plurality of conductive elements in the adhesive material, and an insulating layer on a side surface of the electrically conductive bump, the insulating layer substantially covering an entire side surface of the electrically conductive bump to prevent an electrical short through the side surface.

3 Claims, 6 Drawing Sheets

BUMP ELECTRODE AND METHOD FOR FABRICATING THE SAME

BACKGROUND OF THE INVENTION

1. Field of the Invention

The present invention relates to a bump electrode and a method for fabricating the same, and more particularly, to a bump electrode for bonding the substrate to external terminals and a method for fabricating the same.

2. Discussion of the Related Art

A bonding method using a bump has been widely used in packaging of a semiconductor device or the driving device of a liquid crystal display (LCD). The driving device of a LCD is connected to a thin film transistor (TFT) array substrate. A technique of packaging the driving device, in general, has the following variations: (1) the driving device is mounted on a printed circuit board (PCB), and then the PCB and the TFT array substrate are connected to each other, (2) the driving device is mounted on a flexible tape, and the flexible tape and the TFT array substrate are connected to each other, (3) the driving device is directly mounted on the substrate (Chip on Glass; COG).

The bonding method using a bump is mainly used in a direct package technique. In this method, an anisotropic conductive film (ACF) or anisotropic conductive adhesive (ACA) is used to bond a device having the bump to the terminal of an external substrate. These ACF and ACA contain conductive balls which are 5 to 7 μm large in diameter. When ACF or ACA is coated on a mounting portion of an external substrate and the device having the bump is pressed on the external substrate, the device and substrate are electrically connected to each other through the conductive balls contained in ACF or ACA. However, as the size of semiconductor device becomes smaller, the distance between the bumps formed on the device becomes shorter. Thus, the adjacent bumps can be electrically connected to each other through the conductive balls contained in ACF or ACA. This causes an electrical short in the device.

FIG. 1 is a cross-sectional view of a conventional substrate bump. The conventional bump electrode includes a pad 2 on a semiconductor substrate 1, on which a driving device is formed. A passivation layer 3 is formed on a portion of the pad 2 and an exposed portion of the substrate 1. A barrier metal 4 (used for diffusion stop, adhesive and oxidation resistance layer) is formed on an exposed portion of pad 2 and a portion of the passivation layer 3 over the pad 2. A bump 5 is formed on the barrier metal 4.

FIG. 2 shows a state in which adjacent bumps 5 are electrically connected to each other through conductive balls 6 contained in an adhesive material 7 when the semiconductor substrate 1 is bonded to a substrate 8. In the bonding process, an adhesive material 7, such as ACF or ACA, is coated on the substrate 8, and then heat and pressure are applied to the semiconductor substrate 1 to thereby bond the substrate 1 to the substrate 8. Here, according to heat or pressure applied to the bump 5, the adhesive material 7 flows between the bumps, and gathers the conductive balls in the space between the bumps. In this way, the adjacent bumps can be electrically connected to each other.

The top surface of the bump 5 actually comes into contact with the terminal of the external substrate 9. However, since the side of the bump 5 is exposed, if the bumps are close enough to each other, the conductive balls contained in the adhesive material may gather between the bumps and electrically connect the adjacent bumps. This causes an undesirable electrical short between the adjacent bumps.

SUMMARY OF THE INVENTION

Accordingly, the present invention is directed to a bump electrode and method for fabricating the same that substantially obviates one or more of the problems due to limitations and disadvantages of the related art.

An object of the present invention is to provide a bump electrode and method for fabricating the same, which is suitable for preventing an electrical short in a semiconductor device in the bonding process using bumps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a bump electrode includes a pad formed on a semiconductor substrate; a passivation layer formed on the semiconductor substrate and a portion of the pad; a barrier metal formed on an exposed portion of the pad; a bump formed on the barrier metal; and an insulating layer formed on the side of the bump.

In another aspect, the present invention provides a method for fabricating a bump electrode including the steps of forming a pad on a semiconductor substrate, forming a passivation layer on the pad and semiconductor substrate, and exposing a portion of the pad; forming a barrier metal on the passivation layer and the exposed portion of the pad; forming a bump only on the barrier metal placed on the pad, the bump being formed of conductive material; forming an insulating layer on the passivation layer and the exposed portion of the pad; and removing a portion of the insulating layer to be left only on the side of the bump, the portion being placed on the bump.

In another aspect, a bump electrode includes a semiconductor substrate, a pad formed on the semiconductor substrate, a passivation layer formed on the semiconductor substrate to expose a portion of the pad, a barrier metal formed on the exposed portion of the pad and a portion of the passivation layer, and a bump formed on the barrier metal, in which the bump consists of first and second bumps, the first bump having an oxide layer formed on its side, the second bump being formed on the first bump.

In a further aspect, the present invention provides a method for fabricating a bump electrode including the steps of forming a pad on a semiconductor substrate, forming a passivation layer on the semiconductor substrate including the pad, and exposing a portion of the pad; forming a barrier metal on the passivation layer and the exposed portion of the pad; forming a photoresist pattern to expose the barrier metal placed on the exposed portion of the pad; forming a first bump using the photoresist pattern, the first bump being formed of a first conductive material; forming a second bump on the first bump using the photoresist pattern, the second bump being formed of a second conductive material; and removing the photoresist pattern, and oxidizing the first bump to form an oxide layer on the side of the first bump.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 1:
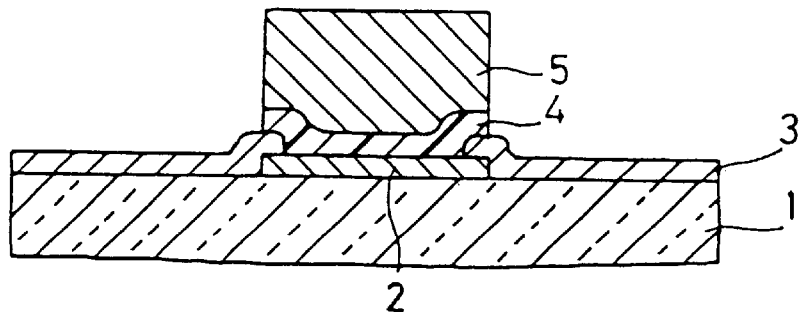
FIG. 1 is a cross-sectional view of a conventional substrate bump.
Figure 2:
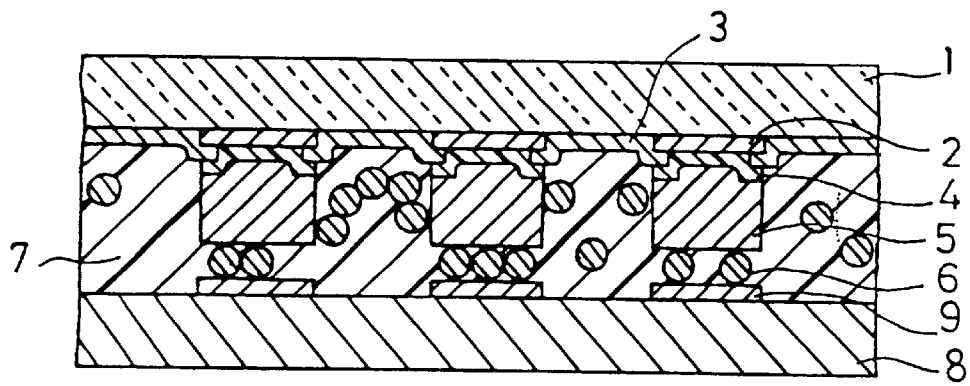
FIG. 2 is a cross-sectional view showing an actual bonding state of a conventional substrate bump.
Figure 3A:
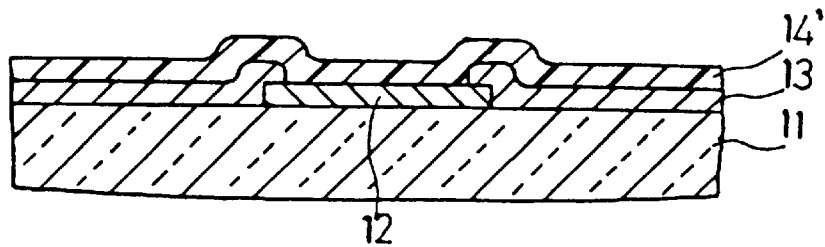
FIGS. 3A to 3E are cross-sectional views showing a structure of a bump electrode and its fabrication process according to a first embodiment of the present invention.
Figure 3B:
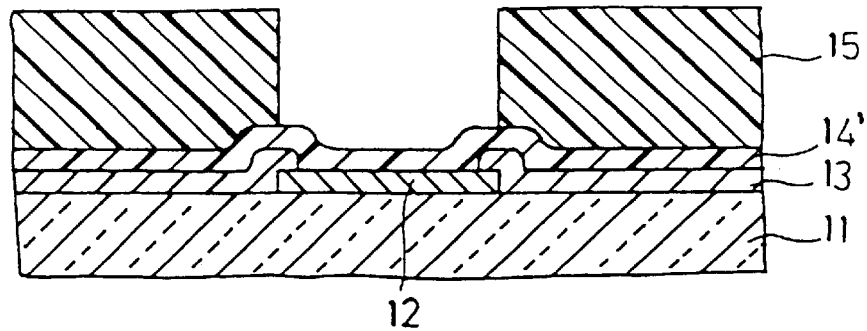
Figure 3C:
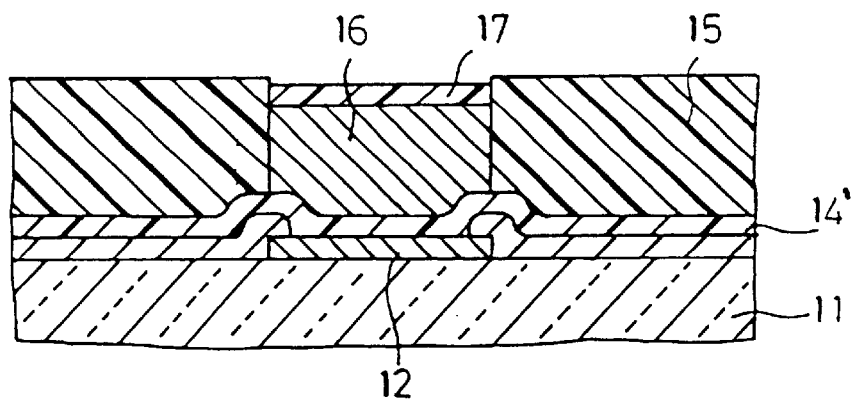
Figure 3D:
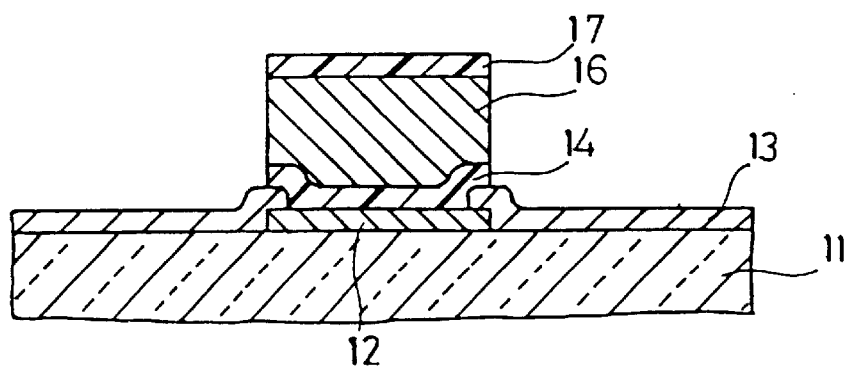
Figure 3E:
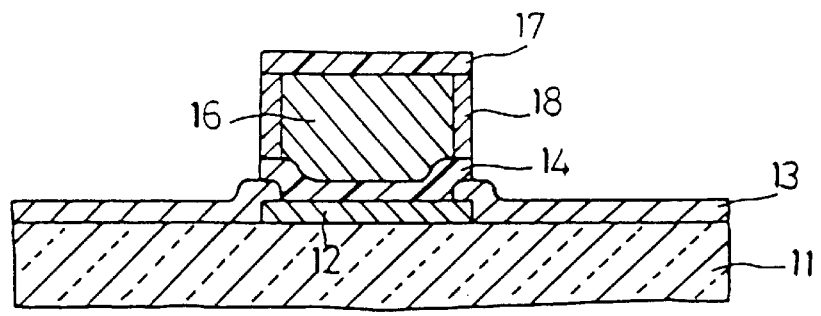

FIG. 3E is a cross-sectional view of a bump electrode according to a first embodiment of the present invention. As shown in FIG. 3E, a pad 12 is formed on a substrate 11 on which circuit elements are formed. A passivation layer 13 is formed on an exposed portion of the substrate 11 and a portion of the pad 12. A diffusion stop portion 14 is formed on an exposed portion of the pad 12 and a portion of the passivation layer 13 over the pad 12. A first bump 16 is formed on the diffusion stop portion 14 and an oxide layer 18 is formed on the sides of the first bump 16. A second bump 17 is formed on the first bump 16.

A method for fabricating the bump electrode according to the first embodiment of the present invention will be explained below with reference to FIGS. 3A to 3E. As shown in FIG. 3A, a pad 12 is formed of a conductive material on a substrate 11. A passivation layer 13 is formed on a portion of the pad 12 and an exposed portion of the substrate 11. A barrier metal 14' is formed on the passivation layer 13 and an exposed portion of the pad 12. Here, the barrier metal 14' has yet to be patterned. The barrier metal 14' is formed of TiW/Au, Ti/Au, or Ti/Pt/Au, for example.

As shown in FIG. 3B, photoresist is coated on the barrier metal 14', and selectively removed to form a photoresist pattern 15 so as to expose a portion of the barrier metal 14' over the pad 12. As shown in FIG. 3C, a first bump 16 is formed on the exposed portion of the barrier metal 14', by deposition (such as electroplating, sputtering, etc.) using the photoresist pattern 15. A second bump 17 is formed on the first bump 16 by electroplating using the photoresist pattern 15. Here, the first bump 16 is made of a material, which is easily oxidized, such as Ni, Al, or Cu. The second bump 17, however, is made of an oxidation resistance material like Au.

As shown in FIG. 3D, the photoresist pattern 15 is removed, and then an exposed portion of barrier metal 14' is removed to form a diffusion stop portion 14. Thereafter, as shown in FIG. 3E, an oxide layer 18 is formed on the side of the first bump 16 by thermal oxidation. Here, since the second bump 17 is formed of an oxidation resistance material, the oxide layer 18 is formed only on the side of the first bump 16.

Figure 4:
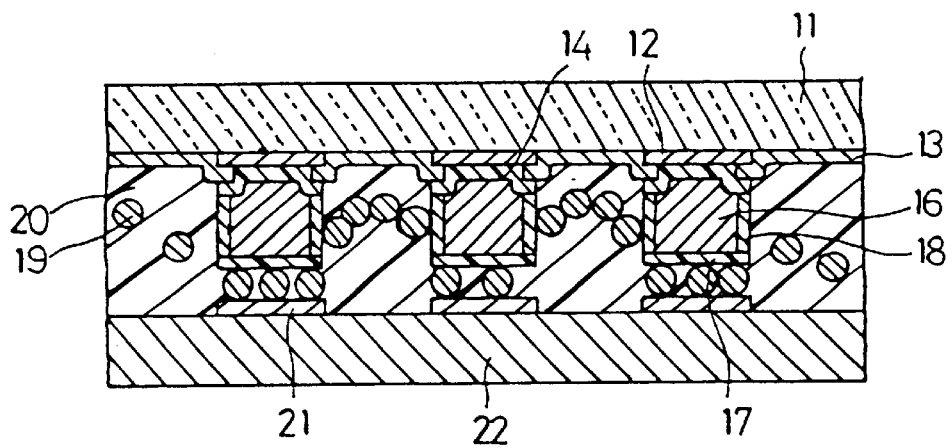
FIG. 4 is a cross-sectional view showing an actual bonding state of a bump electrode according to the first embodiment of the present invention.

FIG. 4 is a cross-sectional view showing an actual bonding state when the bonding is accomplished using the bump according to the first embodiment of the present invention. As shown in FIG. 4, the bump of the substrate 11 is connected to a pad 21 of a substrate 22 using a conductive adhesive material 20. The oxide layer 18 on the side of the first bump 16 prevents the bumps from being electrically short circuited among each other, even though the adhesive material 20 flows among bumps and conductive balls 19 contained in the adhesive material 20 gather to connect the sides of adjacent first bumps 16 to each other.

The first embodiment of the present invention describes the packaging of the driving device of a liquid crystal display. Moreover, the present invention can also be used for a semiconductor device package. In the bump electrode of the present invention, the oxide layer formed on the side of the bump electrically isolates the bump. Accordingly, even if the space between the bumps becomes narrower in a device with a finer pitch structure, an electrical short between the bumps due to aggregation of the conductive balls can be prevented. As a result, higher integration of the semiconductor devices is realized. Also, the oxide layer is formed on the side of the bump without going through a separate masking process. The process is simple and does not sacrifice the yield.

Figure 5A:
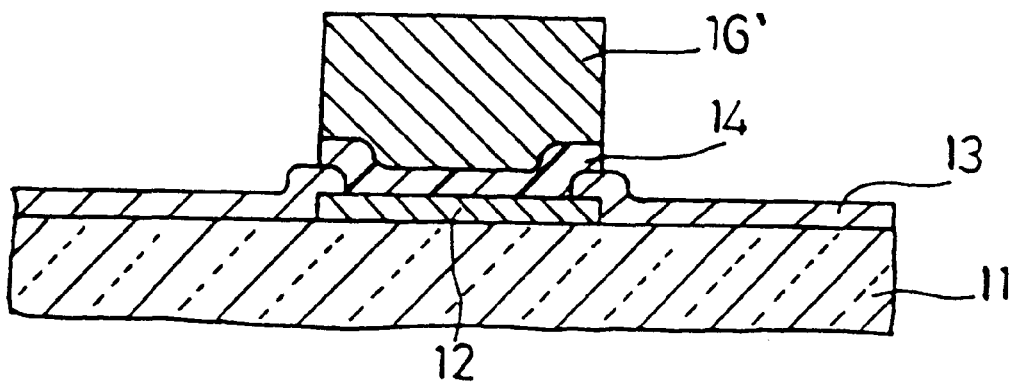
FIGS. 5A to 5D are cross-sectional views showing a method for fabricating a bump electrode according to a second embodiment of the present invention.

A method for fabricating the bump electrode according to a second embodiment of the present invention will be explained below with reference to FIGS. 5A to 5D. As shown in FIG. 5A, a pad 12 is formed of a conductive material, such as aluminum, on a substrate 11 on which a driving device (not shown) is formed. A passivation layer 13, such as a silicon oxide layer or silicon nitride layer, is formed on the overall surface of the substrate including the pad 12, and selectively etched to expose a portion of the pad 12. Here, a portion of the passivation layer 13 covers the edge of the pad 12. Thereafter, a barrier layer (for example, TiW/Au, Ti/Pd/Au) is deposited on the exposed portion of the pad 12 and the passivation layer 13.

A photoresist pattern (not shown) is selectively formed on the barrier metal to expose a portion of the barrier metal on the pad 12. A bump 16' is formed of Au on the barrier metal by electroplating using the photoresist pattern, and then the photoresist pattern is removed. Here, the height of the bump 16' is approximately 15 $\mu$m. Then, the barrier metal is selectively etched to form a diffusion stop portion 14, and heat treatment is carried out.

Figure 5B:
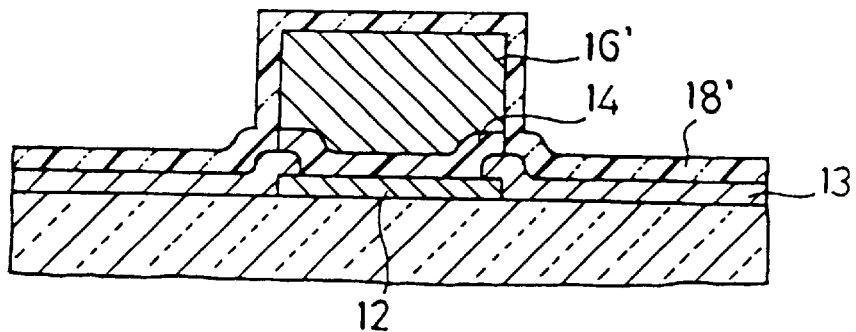
Figure 5C:
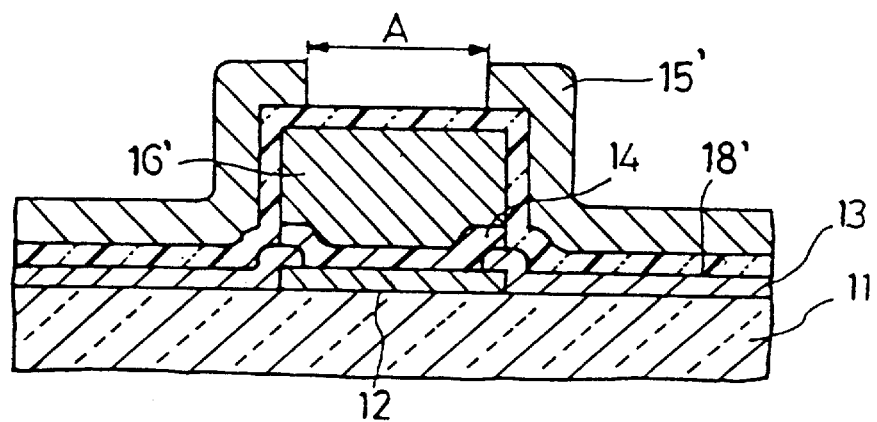

As shown in FIG. 5B, an insulating layer 18', such as a polymer, photosensitive polymer, or silicon nitride layer, is formed on the bump 16', the passivation layer 13 and the exposed portion of the diffusion stop portion 14 through chemical vapor deposition (CVD), physical vapor deposition (PVD) or coating, for example. As shown in FIG. 5C, photoresist is coated on the insulating layer 18', and selectively removed to form a photoresist pattern 15' defining a contact region A on the bump 16'.

As shown in FIG. 5C, the insulating layer 18' is etched using the photoresist pattern 15' as a mask or by photo process (in the case of a photosensitive material), to expose the contact region A on the bump 16'. Then, the photoresist pattern 15' is removed to complete the bump electrode (see FIG. 5D).

Figure 5D:
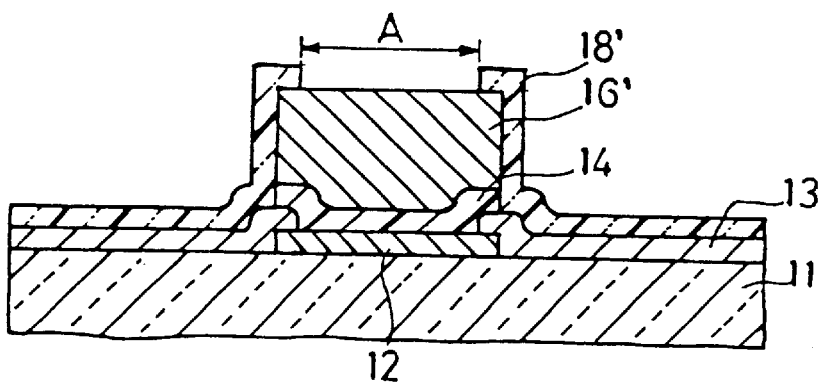

It is also possible to complete the bump electrode without performing the steps shown in FIGS. 5C and 5D. In this case the structure of the bump is given in FIG. 5B.

Figure 6A:
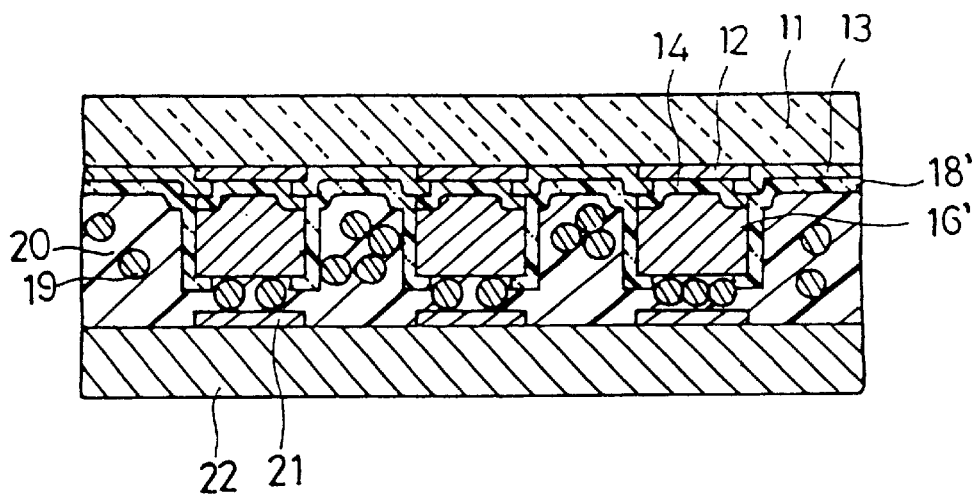
FIGS. 6A and 6B are cross-sectional views showing an actual bonding state of a bump electrode according to the second embodiment of the present invention.
Figure 6B:
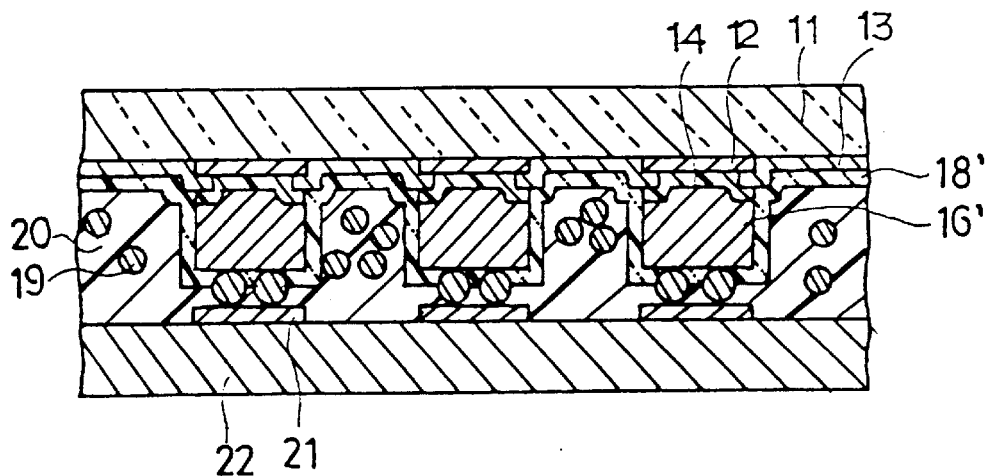

FIGS. 6A and 6B are cross-sectional views showing that a substrate 11, on which the driving device is formed, is mounted on a TFT array substrate 22 of the LCD, using the bump electrode 10 according to the second embodiment of the present invention. FIG. 6A shows the case in which the bump electrode shown in FIG. 5D is used, and FIG. 6B shows the case in which the bump electrode shown in FIG. 5B is used.

As shown in FIGS. 6A and 6B, the bump 16' of the substrate 11 is aligned with the pad 21 formed on the LCD substrate 22. An adhesive material 20 is coated on the LCD substrate. Then heat and pressure are applied thereto to mount the bump. Here, the insulating layer 18' formed on the side of the bump 16' electrically isolates the adjacent bumps from each other even though the adhesive material 20 flows between the bumps 16', and conductive balls 19 contained in the adhesive material gather between bumps 16' so as to connect the sides of adjacent bumps 16' to each other.

In FIG. 6B, the conductive balls 19 contained in the adhesive material 20 are infiltrated into the insulating layer 18' on the top of the bump 16', connecting the bump 16' with the pad 21 formed on the substrate 22.

The bump electrode of the present invention can be used for a semiconductor chip package as well as a package of the driving device of the LCD substrate. When the bump electrode of the present invention is used for a driving device in a finer pitch structure, electrical shorting can be prevented. Furthermore, as shown in FIG. 6A, since the insulating layer defines the contact region A and has a fence shape at the top edge of the bump, the bump structure in FIG. 5D prevents the conductive balls from flowing down with the adhesive material. Accordingly, many conductive balls remain on the bump, so that contact resistance of the device can be reduced.

It will be apparent to those skilled in the art that various modifications and variations can be made in the bump electrode and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A connector on a substrate for connecting a plurality of electrodes formed over the substrate to external terminals, the connector comprising:

a plurality of electrodes over the substrate;

a plurality of electrically conductive bumps over the substrate, each of the electrically conductive bumps being electrically connected to a respective one of the plurality of electrodes;

a plurality of conductive particles on respective top surfaces of the electrically conductive bumps electrically connecting respective electrically conductive bumps to the external terminals; and an insulating layer formed of a nitride or an oxide on the top surface and side surfaces of each of the plurality of electrically conductive bumps to prevent an electrical short which may occur through the side surfaces of the electrically conductive bumps by aggregation of the plurality of conductive particles between the adjacent electrically conductive bumps, wherein the insulating layer is a substantially uniform thick layer being disposed on the side surfaces such that a space is defined between adjacent electrically conductive bumps and such that a thickness of the insulating layer on the substrate is less than a height of the electrically conductive bumps, and on a first portion of the top surface such that a second portion of the top surface is exposed wherein the exposed second portion of the top surface has an area greater than a cross-sectional area of the conductive particles.

2. The connector according to claim 1, wherein the insulating layer includes a polymer layer.

3. A connector structure for connecting a semiconductor device to a plurality of external terminals, the connector structure comprising:

a substrate;

a plurality of pads formed on a top a surface of the substrate;

a plurality of diffusion stop portions each formed on respective ones of the pads a plurality of electrically conductive bump electrodes each formed on a respective one of the diffusion stop portions, each of the electrically conductive bump electrodes defining top and side surfaces;

an insulating layer formed of a nitride or an oxide on the side surface such that a space being defined between the insulating layer formed on the sides of adjacent ones of the electrically conductive bumps and a thickness of the insulating layer on the substrate is less than a height of the electrically conductive bumps, and on a circumferential portion of the top surface on each of the electrically conductive bump electrodes such that a central portion of the top surface of each electrically conductive bump electrodes is exposed by the insulating layer; and a plurality of electrically conductive particles in electrical contact with the exposed central portions of the electrically conductive bump electrodes to connect the electrically conductive bumps to the external terminals, the electrically conductive particles being held in contact with the central portion of the electrically conductive bump electrode by the insulating layer formed on the circumferential portion of the top surface of the electrically conductive bump electrode, wherein the insulating layer prevents an electrical short of the electrically conductive bump electrodes, and wherein each of the exposed central portions has respective areas greater than a cross-sectional area of a respective one of the electrically conductive particles.

* * * * *